(12) United States Patent
Kitaura et al.

(10) Patent No.: US 11,135,683 B2
(45) Date of Patent: Oct. 5, 2021

(54) SOLDER ALLOY AND JUNCTION STRUCTURE USING SAME

(71) Applicant: Panasonic Intellectual Property Management Co., Ltd., Osaka (JP)

(72) Inventors: Hidetoshi Kitaura, Osaka (JP); Akio Furusawa, Osaka (JP); Kiyohiro Hine, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 71 days.

(21) Appl. No.: 16/137,108

(22) Filed: Sep. 20, 2018

(65) Prior Publication Data

US 2019/0099840 A1    Apr. 4, 2019

(30) Foreign Application Priority Data

Sep. 29, 2017    (JP) .............................. JP2017-191443

(51) Int. Cl.
| | |
|---|---|
| *B23K 35/26* | (2006.01) |
| *B23K 1/00* | (2006.01) |
| *B23K 31/02* | (2006.01) |
| *H01L 35/08* | (2006.01) |
| *C22C 13/02* | (2006.01) |
| *H01L 23/00* | (2006.01) |
| *B23K 101/40* | (2006.01) |
| *B23K 101/42* | (2006.01) |

(52) U.S. Cl.
CPC .......... *B23K 35/262* (2013.01); *B23K 1/0008* (2013.01); *B23K 1/0016* (2013.01); *B23K 31/02* (2013.01); *C22C 13/02* (2013.01); *H01L 24/29* (2013.01); *H01L 24/32* (2013.01); *H01L 35/08* (2013.01); *B23K 2101/40* (2018.08); *B23K 2101/42* (2018.08); *H01L 24/83* (2013.01); *H01L 2224/32227* (2013.01); *H01L 2224/32258* (2013.01); *H01L 2224/32503* (2013.01); *H01L 2224/8381* (2013.01); *H01L 2224/83097* (2013.01); *H01L 2224/83192* (2013.01)

(58) Field of Classification Search
None
See application file for complete search history.

(56) References Cited

U.S. PATENT DOCUMENTS 5,851,482 A * 12/1998 Kim .................... B23K 35/262
420/557
9,095,936 B2    8/2015 McIsaac et al.
(Continued)

FOREIGN PATENT DOCUMENTS

CN    102581507        7/2012
DE    2818099 A1 *  11/1979    ............ F16C 33/121
(Continued)

OTHER PUBLICATIONS

Extended European Search Report dated Nov. 30, 2018 in counterpart European Patent Application No. 18195324.1.

*Primary Examiner* — Anthony M Liang
(74) *Attorney, Agent, or Firm* — Wenderoth, Lind & Ponack, L.L.P.

(57) ABSTRACT

A solder alloy, includes: about 3 wt % to about 15 wt % of Sb; about 0.01 wt % to about 1.5 wt % of Te; and about 0.005 wt % to about 1 wt % of at least one element selected from the group consisting of Zn, Co, and Cr; and a balance of Sn.

8 Claims, 2 Drawing Sheets

(56) References Cited

U.S. PATENT DOCUMENTS

| | | |
|---|---|---|
| 2003/0019216 A1 | 1/2003 | Itakura et al. |
| 2005/0029666 A1 | 2/2005 | Kurihara et al. |
| 2016/0325384 A1 | 11/2016 | Liu et al. |
| 2017/0012018 A1 | 1/2017 | Watanabe et al. |

FOREIGN PATENT DOCUMENTS

| | | | | |
|---|---|---|---|---|
| EP | 3 127 652 | | 2/2017 | |
| EP | 3 321 025 | | 5/2018 | |
| GB | 1461371 A | * | 1/1977 | ............ F16C 33/121 |
| JP | 4147875 B | | 9/2008 | |
| JP | 2014-057974 | | 4/2014 | |
| WO | 2004/026527 | | 4/2004 | |
| WO | 2017/164194 | | 9/2017 | |

\* cited by examiner

FIG. 1

SOLDER ALLOY AND JUNCTION STRUCTURE USING SAME

TECHNICAL FIELD

The technical field relates to solder alloys used in power modules and the like, and junction structures using the same.

BACKGROUND

As examples of conventional solder alloys and junction structures using the same, brazing materials including 5-20 mass % of Sb, 0.01-5 mass % of Te, and a remnant of Sn, optional additives and inevitable impurities, and junction structures in which semiconductor devices assembled by use of the brazing materials, and substrates are joined together are disclosed in the publication of Japanese Patent No. 4147875.

SUMMARY

With regard to the solder alloys disclosed in the publication of Japanese Patent No. 4147875, Te, Ag, Cu, Fe or Ni is combined with Sn to improve junction reliability.

However, the disclosed solder alloys do not realize junction reliability sufficient to endure a heat cycle test carried out at 150° C. or higher.

Thus, development of any technologies that can realize sufficient junction reliability required in high power modules that are operated at high temperature has been sought.

The disclosure has been completed in order to solve the above-mentioned problem in the conventional arts, and an object of the disclosure is to provide a solder alloy that makes it possible to improve crack resistant properties in solder joint parts, and to realize high junction reliability.

According to one aspect of the disclosure, provided is solder alloy, including: about 3 wt % to about 15 wt % of Sb; about 0.01 wt % to about 1.5 wt % of Te; and about 0.005 wt % to about 1 wt % of at least one element selected from the group consisting of Zn, Co, and Cr; and a balance of Sn.

Furthermore, according to another aspect of the disclosure, provided is a junction structure, including: a semiconductor element including a first metal layer; a circuit substrate including a second metal layer; and a solder joint layer that joins the first metal layer in the semiconductor element and the second metal layer in the circuit substrate, wherein the solder joint layer at least includes Sn, Sb and Te, and further includes at least one element selected from the group consisting of Zn, Co and Cr, wherein an SnNi alloy or an SnCu alloy is present in a boundary face between the first metal layer and the solder joint layer, and in a boundary face between the second metal layer and the solder joint layer.

In the present specification, the term "content" refers to a weight-based proportion of each element to the total weight of a solder alloy, and is represented by wt % (percent by weight).

In the present specification, the "solder alloy" may include traces (e.g. less than about 0.005 wt %) of inevitable metals as long as a metal composition of the solder alloy is comprised essentially of the defined metals.

The solder alloy may have any given shape or form. The solder alloy may be employed singularly, or may be employed in combination with ingredients (e.g., flux) other than metals, for purposes of soldering.

According to the disclosure, it becomes possible to provide a solder alloy that makes it possible to improve crack resistant properties in solder joint parts, thus realizing high junction reliability, and a junction structure using such a solder alloy.

DESCRIPTION OF EMBODIMENTS

A solder alloy according to the disclosure includes: about 3-15 wt % of Sb; about 0.01-1.5 wt % of Te; about 0.005-1 wt % of at least one element selected from the group consisting of Zn, Co and Cr; and a balance of Sn.

Since the solder alloy having the above-mentioned composition includes at least Te, and also includes at least one element selected from the group consisting of Zn, Co and Cr, effects brought about through formation of a solid solution of Te, and effects in which atoms of Sn that forms a solid solution together with Te are intricately replaced with Zn, Co and Cr, which each have an ion radius different from that of Sn, will be obtained.

Thus, dislocations are caused in parts where such intricate replacements of elements occur, and, as a result, elongation properties at high temperature will be improved.

Therefore, compared with SnSb-type solders including only Te, the solder alloy according to the disclosure exhibits improved elongation properties at high temperature, and thus, repeated stress caused during heat cycles can be absorbed.

Accordingly, when the junction structure is produced based on the solder alloy, it becomes possible to realize higher junction reliability in the junction structure.

In the above solder alloy, the sum of contents of Zn, Co and Cr in the first embodiment may be from about 0.005 wt % to about 1 wt %.

In the above solder alloy, the content of Zn may be from about 0.005 wt % to about 1 wt %.

In the solder alloy, the content of Co may be from about 0.005 wt % to about 1 wt %.

For a solder alloy according to a fifth embodiment, the content of Cr may be from about 0.005 wt % to about 1 wt %.

A junction structure according to the disclosure includes: a semiconductor element including a first metal layer; a circuit substrate including a second metal layer; and a solder joint layer that joins the first metal layer in the semiconductor element and the second metal layer in the circuit substrate, that includes at least Sn, Sb and Te, and that includes at least one element selected from the group consisting of Zn, Co and Cr, wherein an SnNi alloy or an SnCu alloy is included in a boundary face between the first metal layer and the solder joint layer, and in a boundary face between the second metal layer and the solder joint layer.

The junction structure having the above structure exhibits excellent crack-resistant properties in heat cycles, and thus, realizes higher junction reliability.

In the above-mentioned junction structure, the SnNi alloy or the SnCu alloy may include at least one element selected from the group consisting of Te, Zn, Co and Cr.

Hereinafter, solder alloys and junction structures according to some embodiment will be described with reference to the drawings.

In addition, substantially same members are provided with same reference symbols in the drawings.

Figure 1:
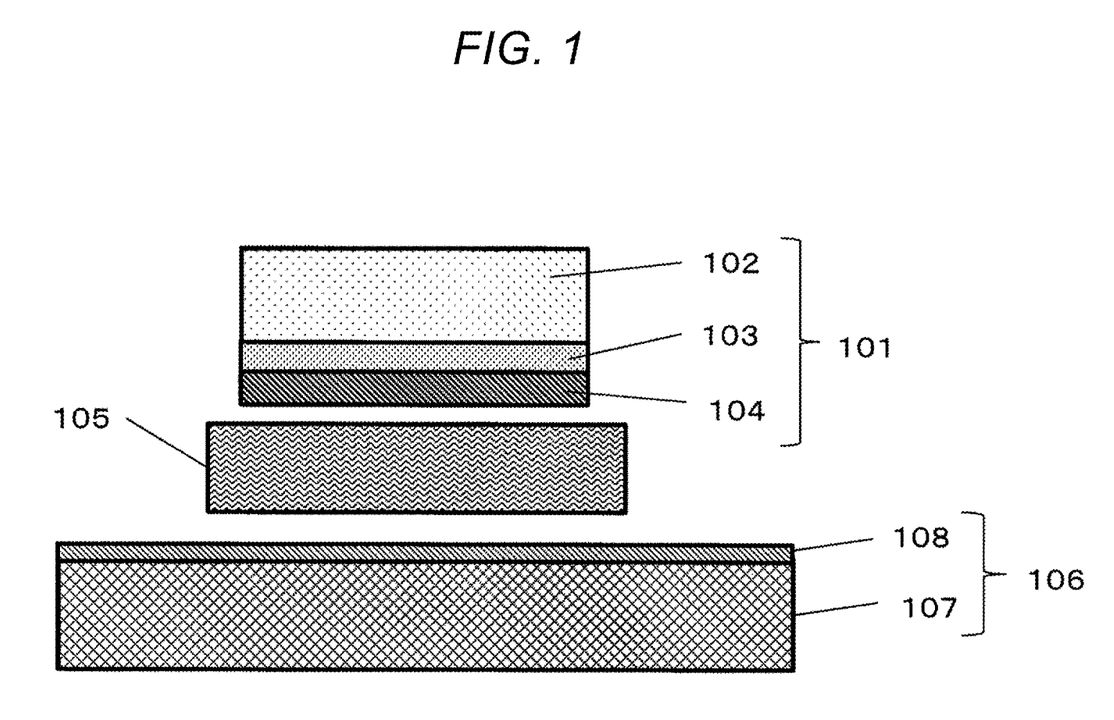
FIG. 1 is a diagram that illustrates a method for producing a junction structure in an embodiment.

FIG. 1 is a diagram that illustrates a method for producing a junction structure according to one embodiment before the elements are joined.

A semiconductor element 101, a solder alloy 105, and a circuit substrate 106 are provided as members to manufacture the junction structure.

Figure 2:
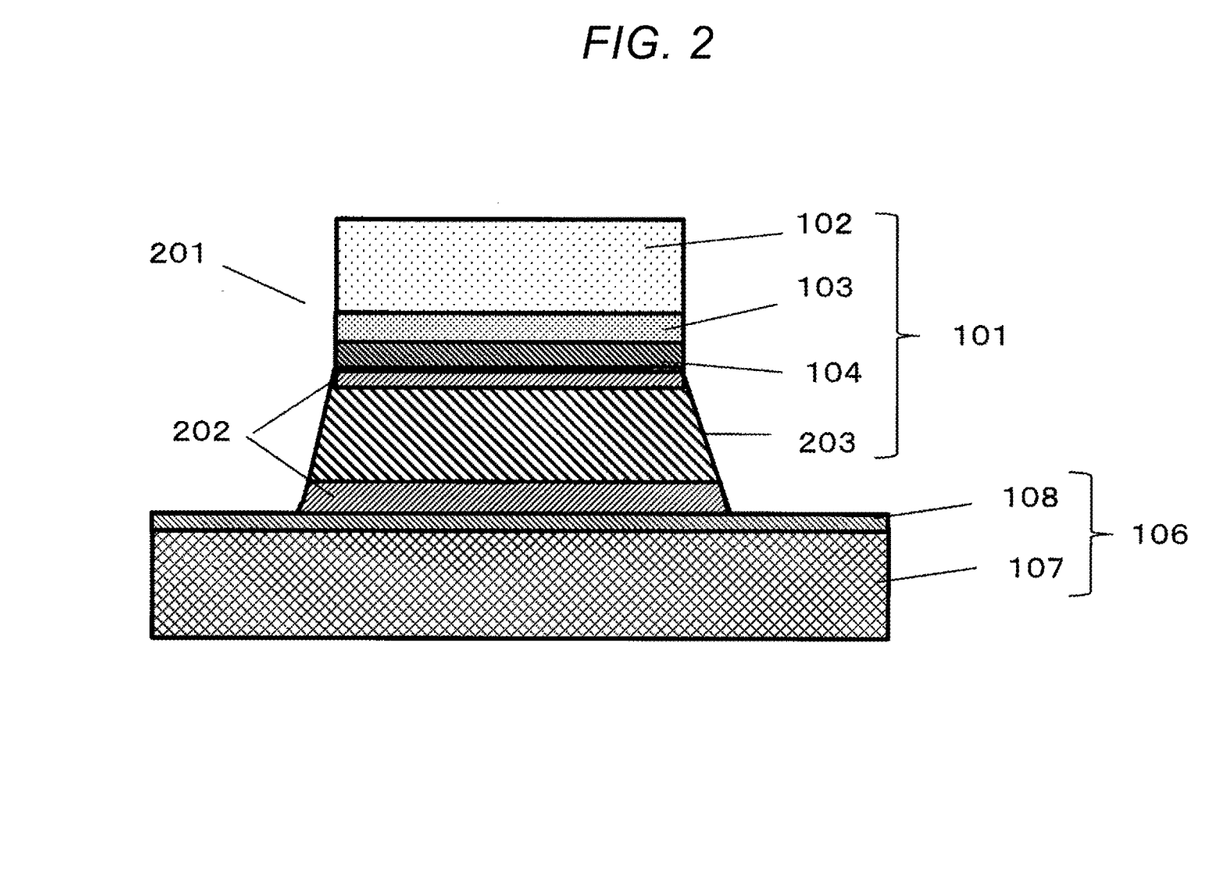
FIG. 2 is a diagram that illustrates a method for producing a junction structure in an embodiment.

FIG. 2 is a diagram that illustrates a method for producing a junction structure according to one embodiment after the elements are joined together.

The provided members are located as shown in FIG. 1, and then, the members are heated to manufacture the junction structure 201.

At first, details on the material of the solder alloy, and a production method thereof will be described below.

<Solder Alloy 105>

The solder alloy 105 is an alloy that includes Sb, Te, at least one element selected from the group consisting of Zn, Co and Cr, and a balance of Sn.

The content of Sb in the solder alloy 105 may be from about 3 wt % to about 15 wt %.

When the content of Sb in the solder alloy falls within such a range, thermal fatigue properties in solder joint parts will be improved.

In the solder alloy 105, the content of Te may be from about 0.01 wt % to about 1.5 wt %, the content of the at least one element selected from the group consisting of Zn, Co and Cr may be from about 0.005 wt % to about 1 wt %, and the remainder may be Sn.

The older alloys according to present embodiments include Te, and also contain the predetermined contents of at least one element selected from the group consisting of Zn, Co and Cr.

Accordingly, at high temperature, some of the atoms of Te that form a solid solution together with Sn are replaced with at least one element selected from the group consisting of Zn, Co and Cr, and thus, dislocations are caused therein. As a consequence, improvements on the elongation at high temperature will be ensured.

As a result, solder alloys according to present embodiments exhibit more excellent elongation properties as compared with SnSb-type solders that include only Te.

Accordingly, since stress possibly caused during heat cycles can be absorbed by the solder alloys, thereby improving crack-resistant properties in resulting junction structures, and thus, junction structures with higher junction reliability can be realized.

A size of the solder alloy 105 may vary depending on types of produced junction structures. For example, the solder alloy 105 may be 10 mm square, and may have a thickness from about 0.05 mm to about 0.5 mm.

When the thickness of the solder alloy 105 is about 0.5 mm or smaller, the resulting solder junction part will have low thermal resistance, and thus, it becomes possible to efficiently release heats caused from the semiconductor element 101.

When the thickness of the solder alloy 105 is about 0.05 mm or larger, it becomes possible to suppress generation of voids possibly caused during the joining process, thereby improving thermal resistance in the solder junction part.

Next, the junction structure according to the disclosure will be described with reference to the drawings.

The junction structure according to the disclosure includes: a semiconductor element 101 including a metalization layer (first metal layer) 104, a circuit substrate 106 including a plated layer (second metal layer) 108, and a solder joint layer 203 that joins the metalization layer 104 in the semiconductor element 101 and the plated layer 108 in the circuit substrate 106.

The solder joint layer 203 includes at least Sn, Sb and Te, and also, includes at least one element selected from the group consisting of Zn, Co, and Cr.

A boundary face between the metalization layer 104 in the semiconductor element 101 and the solder joint layer 203, and a boundary face between the plated layer 108 in the circuit substrate 106 and the solder joint layer 203 include an SnNi alloy, or an SnCu alloy.

<Semiconductor Element 101>

The semiconductor element 101 includes: a silicon chip 102; an ohmic layer 103 that is formed on the bottom surface of the silicon chip 102; and the metalization layer (first metal layer) 104 that is formed on the bottom surface of the ohmic layer 103.

The silicon chip 102 may preferably have a vertical length of about 10 mm, and a width of about 10 mm, and a thickness of 0.2 mm in terms of facilitation of the production. However, the silicon chip 102 is not limited to such a specification of dimension, and may have various dimensions.

The ohmic layer 103 in the semiconductor element 101 is a layer that is formed of any given pure metal or alloy. For example, Ti, Al, Cr, or Ni, or alloys including some of these metals can be adopted therefor. However, the ohmic layer 103 is not limited to these materials.

When the above-mentioned metals or alloys are used for the ohmic layer, suitable ohmic junction would be realized.

A thickness of the ohmic layer 103 is not particularly limited. For example, the thickness may be from about 0.05 µm to about 0.5 µm, and, more specifically, may be about 0.1 µm.

When the ohmic layer 103 has such a thickness, suitable values of thermal resistance would easily be exhibited, and high junction reliability would easily be secured.

The metalization layer (first metal layer) 104 in the semiconductor element 101 is a layer that is formed of any given pure metal or alloy. For example, Ni or Cu, or any alloys including some of these metals can be adopted therefor. However, the metalization layer (first metal layer) 104 is not limited to these materials.

A thickness of the metalization layer 104 is not particularly limited. For example, the thickness may be from about 0.5 µm to about 10 µm, and, more specifically, may be about 1 µm.

When the metalization layer 104 has such a thickness, it becomes possible to rigidly join the metalization layer 104 and the solder alloy.

<Circuit Substrate 106>

The circuit substrate 106 may include a leadframe 107, and the plated layer (second metal layer) 108 that is formed on a surface of the leadframe 107.

For the leadframe 107 in the circuit substrate 106, any materials having sufficient thermal conductivity (e.g., metals and ceramics) may be used.

As examples of materials for the leadframe 107, copper, aluminum, alumina, aluminum nitride, silicon nitride, and the like can be mentioned. However, the leadframe 107 are not limited to these materials.

The leadframe 107 may preferably have a vertical length of about 20 mm, and a width of about 20 mm, and a thickness of about 1 mm in terms of facilitation of the production. However, the leadframe 107 is not limited to such a specification of dimension, and may have various dimensions.

The plated layer (second metal layer) 108 in the circuit substrate 106 is a layer that is formed of any given metal or alloy. For example, Ni or Cu, or alloys including these metals can be adopted therefor. However, the plated layer (second metal layer) 108 is not limited to these materials.

A thickness of the plated layer is not particularly limited.

For example, thickness may be from about 0.5 μm to about 10 μm, and, more specifically, may be about 1 μm.

When the plated layer has such a thickness, it would become possible to rigidly join the plated layer and the solder alloy.

<Junction Structure 201>

A junction structure 201 that is produced by use of a solder alloy according to a present embodiment is schematically illustrated in FIG. 2.

The junction structure 201 has a structure in which the semiconductor element 101 and the circuit substrate 106 are joined together via the alloy layer 202 and the solder joint layer 203.

The junction structure 201 can be produced in the following way.

(i) At first, as shown in FIG. 1, the solder alloy 105 is placed on the plated layer (second metal layer) 108 in the circuit substrate 106, and then, the semiconductor element 101 is further placed on the solder alloy 105 such that the solder alloy 105 and the metalization layer (first metal layer) 104 in the semiconductor element 101 are brought into contact with each other.

(ii) Subsequently, the resulting structure is heated from room temperature to about 300° C. at a rate of 10° C./minute, and then, is allowed to stand at about 300° C. for about one minute. Then, the resulting structure is cooled to room temperature at a rate of about 10° C./minute.

In the above way, alloy layers 202 are formed between the solder alloy 105 and the metalization layer 104, and between the solder alloy 105 and the plated layer 108, respectively, and thus, the junction structure 201 as shown in FIG. 2 can be produced.

The alloy layers 202 in the junction structure 201 are made of intermetallic compounds that are formed through the above-mentioned process for producing the junction structure.

When the metalization layer 104 and the plated layer 108 are made of Ni or Cu, the alloy layers 202 would include SnNi alloys or SnCu alloys.

SnNi alloys or SnCu alloys are formed in the alloy layers 202 that are located between the metalization layer 104 and the solder joint layer 203, and between the plated layer 108 in the circuit substrate and the solder joint layer 203, respectively, and thus, the solder joint layer 203, and the metalization layer 104 and the plated layer 108 in the circuit substrate are joined through metals, thereby realizing sufficient junction strength.

The SnNi alloys or SnCu alloys included in the alloy layers 202 may include at least one element selected from the group consisting of Te, Zn, Co, and Cr.

When the SnNi alloys or SnCu alloys may include at least one element selected from the group consisting of Te, Zn, Co, and Cr, the alloy layers 202 will be formed of multi-component alloys. As a result, the alloy layers will have improved strength, and thus, it becomes possible to suppress generation of cracks in the alloy layers 202 even when stress is applied to the alloy layers through heat cycles.

The solder joint layer 203 in the junction structure 201 would include Sb and Te, and at least one metal element selected from the group consisting of Zn, Co and Cr, which had been included in the solder alloy 105, and would have approximately the same composition as the solder alloy 105 before the junction process is carried out. However, the content of Sn in the solder joint layer 203 would be reduced as a function of a proportion of Sn reacted during the process of formation of the alloy layers 202.

EXAMPLES

In Examples 1 and Comparative Example 2, it was presumed that repeated stress caused during heat cycles could be absorbed by elongation of solder alloys at high temperature, and therefore, elongations of the solder alloys were confirmed.

Next, in Examples 2-5, and Comparative Examples 2-5, evaluations were carried out based on configurations of implementation structures that are close to conditions for actual power modules, in order to confirm that improvements on elongation of the solder alloy at high temperature in Example 1 suppress causes of cracks in solder alloys during heat cycles.

In the examples and the comparative examples, amounts of the elements were varied in order to examine any compositions of solder alloys that makes it possible to improve the crack-resistant properties.

Example 1

As shown in Table 1, contents of Sb, Te, Zn, Co, and Cr, respectively, were varied while Sn was employed for the remainder, to prepare solder alloys 105. Then, the prepared solder alloys 105 were subjected to tension tests in atmospheres at 200° C.

<Evaluations>

For the tension tests, evaluations samples were prepared by casting solder alloys in dumbbell shapes.

With regards to the shapes of evaluation samples, parts that were immobilized in the tension tests each had a diameter of about 6 mm, and a length of about 20 mm, and constricted parts of the dumbbell shapes each had a diameter of about 3 mm, and a length of about 20 mm.

A distance between upper and lower sample-immobilization jigs of a tension-testing machine was set to about 20 mm to immobilize the evaluation samples therebetween, and the temperature of atmosphere was adjusted to 200° C. Then, the evaluation samples were pulled by the tension-testing machine such that forces are applied to the evaluation samples only in the axial direction to carry out the tension tests for the evaluation samples.

A proportion of an increase in the distance between the immobilization jigs to the baseline of 20 mm, which is the distance between the immobilization jigs before the start of the tension test, when the evaluation samples were fractured in the tension test, was regarded as an elongation (%) of an evaluation sample.

For example, if the distance between the immobilization jigs when an evaluation sample is fractured is 40 mm, then, an elongation of the evaluation sample=(40−20)/20× 100=100(%).

In a heat cycle test, the temperature was raised from 150° C. to 175° C. That is, the temperature is raised about 1.2-fold. Therefore, for rates of elongations, a 1.2-fold increase or higher was regarded as an acceptability criterion.

Measurement results of elongations (%) obtained in the tension test are shown in Table 1.

TABLE 1

| | Sb Content (wt %) | Te Content (wt %) | Zn Content (wt %) | Co Content (wt %) | Cr Content (wt %) | Elongation ( %) |
|---|---|---|---|---|---|---|
| Example 1-1 | 3 | 0.01 | 0.005 | 0 | 0 | 122 |
| Example 1-2 | 15 | 0.01 | 0.005 | 0 | 0 | 120 |
| Example 1-3 | 3 | 0.01 | 0 | 0.005 | 0 | 123 |
| Example 1-4 | 15 | 0.01 | 0 | 0.005 | 0 | 119 |
| Example 1-5 | 3 | 0.01 | 0 | 0 | 0.005 | 118 |
| Example 1-6 | 15 | 0.01 | 0 | 0 | 0.005 | 115 |
| Example 1-7 | 3 | 0.01 | 0.005 | 0.005 | 0.005 | 124 |
| Example 1-8 | 15 | 0.01 | 0.005 | 0.005 | 0.005 | 126 |
| Comparative Example 1-1 | 3 | 0.01 | 0 | 0 | 0 | 87 |
| Comparative Example 1-2 | 15 | 0.01 | 0 | 0 | 0 | 90 |
| Comparative Example 1-3 | 3 | 0.025 | 0 | 0 | 0 | 89 |
| Comparative Example 1-4 | 15 | 0.025 | 0 | 0 | 0 | 91 |

With regard to the results of the tension test, a sample obtained in the Example 1-1 (a content of Sb was 3 wt %, a content of Te was 0.01 wt %, and a content of Zn was 0.005 wt %) exhibited an elongation of 122%. Furthermore, a sample obtained in Example 1-2 (a content of Sb was 15 wt %, a content of Te was 0.01 wt %, and a content of Zn was 0.005 wt %) exhibited an elongation of 120%.

Thus, these samples exhibited excellent results, as compared with elongations of 87% and 90% for Comparative Examples 1-1 and 1-2, respectively, both of which did not include any Zn.

In the same manner, a sample obtained in Example 1-3 (a content of Sb was 3 wt %, a content of Te was 0.01 wt %, and a content of Co was 0.005 wt %) exhibited an elongation of 123%. In addition, a sample obtained in Example 1-4 (a content of Sb was 15 wt %, a content of Te was 0.01 wt %, and a content of Co was 0.005 wt %) exhibited an elongation of 119%.

Moreover, a sample obtained in Example 1-5 (a content of Sb was 3 wt %, a content of Te was 0.01 wt %, and a content of Cr was 0.005 wt %) exhibited an elongation of 118%. In addition, a sample obtained in Example 1-6 (a content of Sb was 15 wt %, a content of Te was 0.01 wt %, and a content of Cr was 0.005 wt %) exhibited an elongation of 115%.

Furthermore, a sample obtained in Example 1-7 (a content of Sb was 3 wt %, a content of Te was 0.01 wt %, and a content of Zn was 0.005 wt %, a content of Co was 0.005 wt %, and a content of Cr was 0.005 wt %) exhibited an elongation of 124%. In addition, a sample obtained in Example 1-8 (a content of Sb was 15 wt %, a content of Te was 0.01 wt %, a content of Zn was 0.005 wt %, a content of Co was 0.005 wt %, and a content of Cr was 0.005 wt %) exhibited an elongation of 126%.

Thus, these samples exhibited excellent results, as compared with 89% and 91% for Comparative Examples 1-3 and 1-4, respectively, both of which did not contain any Zn, Co and Cr, but contained increased amounts of Te.

<Results>

Based on the above results, the samples of Examples 1-1 to 1-6 exhibited elongations beyond 1090, which is about 1.2 larger than 91% for Comparative Example 1-4 (which actually exhibited the largest value among the comparative examples). Thus, all of the samples in Examples 1-1 to 1-6 satisfied the acceptability criterion.

Accordingly, it was revealed that, when not only Sb and Te but also at least one element selected from the group consisting of Zn, Co and Cr are included besides Sn, elongation properties at high temperature can effectively be improved.

When Te and at least one element selected from the group consisting of Zn, Co and Cr are included, formation of a solid solution of Te in an Sn phase, and subsequent formation of a solid solution of at least one element selected from the group consisting of Zn, Co and Cr in the resulting Sn/Te phase occur.

Accordingly, it is considered that such a solder system exhibits improved elongation properties at higher temperature, as compared with Sn/Sb-type solders that additionally include only Te.

Thus, the above solder system can absorb repeated stress possibly caused during heat cycles, thereby realizing high junction reliability in produced junction structures.

Example 2

In Examples 2-1 to 2-36, junction structures were prepared based on solder alloys 105 each having a composition in which a content of Sb was from 3 wt % to 15 wt %, a content of Te was 0.01 wt % to 1.5 wt %, a content of Zn was from 0.005 wt % to 1 wt %, and the remainder was Sn.

In Example 2, it was verified that improvements on elongation of the solder alloy at high temperature confirmed in Example 1 realize high junction reliability in implementation structures that were close to conditions for actual power modules.

Additionally, by varying contents of Sb, Te and Zn, which correspond to elements added to alloys, ranges for elements exhibiting the effects were confirmed.

The content of Sb was adjusted to a range of amount in which precipitation-enhancing effects due to SnSb compounds were obtained.

For amounts of Te and Zn, minimums amounts thereof that form solid solutions in the solder alloys, thereby achieving sufficient solid-solution enhancing effects, and maximum amounts thereof that do not exceed limits for formation of solid solutions, not resulting in precipitations, were included in the alloys, and the produced structures were subjected to a heat cycle test.

In the compositional range for each of the elements, organization enhancements, i.e., precipitation enhancement and solid solution formation enhancement, can simultaneously be realized.

Additionally, verification was carried out based on the same compositional ranges in Examples 3-5.

At first, a solder alloy 105, a semiconductor element 101, and a circuit substrate 106 were prepared.

In a semiconductor element 101, an ohmic layer 103 formed of Ti was provided on a bottom surface of a silicon chip 102 with a length of 10 mm, a width of 10 mm, and a thickness of 0.2 mm, and a metalization layer 104 formed of Ni was further provided on a bottom surface of the ohmic layer 103.

In a circuit substrate 106, a copper-made leadframe with a length of 20 mm, a width of 20 mm, and a thickness of 1 mm was provided, and a Ni-made plated layer 108 with a thickness of 1 μm was provided on a surface of the leadframe 107.

Then, a solder alloy 105 with a thickness of 0.1 mm was placed on the plated layer 108 in the prepared circuit substrate 106, and then, the semiconductor element 101 was further placed on the solder alloy 105 such that the solder alloy 105 and a Ni-made metalization layer 104 are brought into contact with each other. Subsequently, the resulting structure was heated from room temperature to 300° C. at a rate of 10° C./minute.

The structure was allowed to stand at 300° C. for one minute, and then, was cooled to room temperature at a rate of −10° C./minute. Thus, a junction structure 201 was produced in this way.

Comparative Example 2

In Comparative Examples 2-1 and 2-2, junction structures were prepared based on solder alloys each having a composition in which a content of Sb was 7 wt %, a content of Te was from 0.01 wt % to 1.5 wt %, and the remainder was Sn.

In Comparative Examples 2-3 to 2-12, junction structures were prepared based on solder alloys each having a composition in which a content of Sb was 2 wt % or 16 wt %, a content of Te was from 0.01 wt % to 1.5 wt %, a content of Zn was from 0.005 wt % to 1 wt %, and the remainder was Sn.

<Evaluations>

The junction structures prepared in Examples 2-1 to 2-36, and Comparative Examples 2-1 to 2-12 were subjected to molding using sealing resins for semiconductors. Then, the resulting junction structures were evaluated for crack-resistant properties based on a heat-cycle test.

The heat-cycle test was carried out using a liquid test tank. An exposure to −40° C. for 5 minutes, and a subsequent exposure to 175° C. for 5 minutes were counted as one cycle, and the samples were subjected to 500 cycles thereof.

The samples that were subjected to the test were observed by using an ultrasonic microscope, and thus, crack-generation rates were calculated by dividing delamination areas by junction areas.

When crack-generation rates are 25% or higher, it becomes impossible to efficiently release heat caused by silicon chips to leadframes. Therefore, when samples exhibited a crack-generation rate of 25% or higher, they were considered as inferior. When samples exhibited a crack-generation rate of 10% to less than 25%, they were considered as good. When samples exhibited a crack-generation rate of less than 10%, they were considered as excellent.

Compositions of the solder alloys, crack-generation rates obtained through the heat-cycle test, and evaluation results are shown in Table 2.

TABLE 2

| | Sn Content (wt %) | Sb Content (wt %) | Te Content (wt %) | Zn Content (wt %) | Crack-generation rate (%) | Evaluation |
|---|---|---|---|---|---|---|
| Example 2-1 | Balance | 3 | 0.01 | 0.005 | 23 | Good |
| Example 2-2 | Balance | 3 | 0.05 | 0.005 | 9 | Excellent |
| Example 2-3 | Balance | 3 | 0.5 | 0.005 | 7 | Excellent |
| Example 2-4 | Balance | 3 | 1.5 | 0.005 | 21 | Good |
| Example 2-5 | Balance | 3 | 0.01 | 0.1 | 21 | Good |
| Example 2-6 | Balance | 3 | 0.05 | 0.1 | 6 | Excellent |
| Example 2-7 | Balance | 3 | 0.5 | 0.1 | 8 | Excellent |
| Example 2-8 | Balance | 3 | 1.5 | 0.1 | 20 | Good |
| Example 2-9 | Balance | 3 | 0.01 | 1 | 18 | Good |
| Example 2-10 | Balance | 3 | 0.1 | 1 | 11 | Good |
| Example 2-11 | Balance | 3 | 1 | 1 | 19 | Good |
| Example 2-12 | Balance | 3 | 1.5 | 1 | 23 | Good |
| Example 2-13 | Balance | 7 | 0.01 | 0.005 | 21 | Good |
| Example 2-14 | Balance | 7 | 0.05 | 0.005 | 7 | Excellent |
| Example 2-15 | Balance | 7 | 0.5 | 0.005 | 5 | Excellent |
| Example 2-16 | Balance | 7 | 1.5 | 0.005 | 19 | Good |
| Example 2-17 | Balance | 7 | 0.01 | 0.1 | 21 | Good |
| Example 2-18 | Balance | 7 | 0.05 | 0.1 | 5 | Excellent |
| Example 2-19 | Balance | 7 | 0.5 | 0.1 | 7 | Excellent |
| Example 2-20 | Balance | 7 | 1.5 | 0.1 | 18 | Good |
| Example 2-21 | Balance | 7 | 0.01 | 1 | 10 | Good |
| Example 2-22 | Balance | 7 | 0.1 | 1 | 13 | Good |
| Example 2-23 | Balance | 7 | 1 | 1 | 18 | Good |
| Example 2-24 | Balance | 7 | 1.5 | 1 | 22 | Good |
| Example 2-25 | Balance | 15 | 0.01 | 0.005 | 19 | Good |
| Example 2-26 | Balance | 15 | 0.05 | 0.005 | 5 | Excellent |
| Example 2-27 | Balance | 15 | 0.5 | 0.005 | 4 | Excellent |
| Example 2-28 | Balance | 15 | 1.5 | 0.005 | 16 | Good |
| Example 2-29 | Balance | 15 | 0.01 | 0.1 | 19 | Good |
| Example 2-30 | Balance | 15 | 0.05 | 0.1 | 7 | Excellent |
| Example 2-31 | Balance | 15 | 0.5 | 0.1 | 5 | Excellent |
| Example 2-32 | Balance | 15 | 1.5 | 0.1 | 17 | Good |
| Example 2-33 | Balance | 15 | 0.01 | 1 | 15 | Good |
| Example 2-34 | Balance | 15 | 0.1 | 1 | 19 | Good |
| Example 2-35 | Balance | 15 | 1 | 1 | 21 | Good |
| Example 2-36 | Balance | 15 | 1.5 | 1 | 23 | Good |
| Comparative Example 2-1 | Balance | 7 | 0.01 | 0 | 34 | Inferior |
| Comparative Example 2-2 | Balance | 7 | 1.5 | 0 | 31 | Inferior |
| Comparative Example 2-3 | Balance | 7 | 0.01 | 1.5 | 29 | Inferior |
| Comparative Example 2-4 | Balance | 7 | 1.5 | 0.001 | 25 | Inferior |
| Comparative Example 2-5 | Balance | 2 | 0.01 | 0.005 | 28 | Inferior |
| Comparative Example 2-6 | Balance | 2 | 0.01 | 1 | 29 | Inferior |
| Comparative Example 2-7 | Balance | 2 | 1.5 | 0.005 | 34 | Inferior |
| Comparative Example 2-8 | Balance | 2 | 1.5 | 1 | 33 | Inferior |
| Comparative Example 2-9 | Balance | 16 | 0.01 | 0.005 | 25 | Inferior |
| Comparative Example 2-10 | Balance | 16 | 0.01 | 1 | 27 | Inferior |
| Comparative Example 2-11 | Balance | 16 | 1.5 | 0.005 | 33 | Inferior |
| Comparative Example 2-12 | Balance | 16 | 1.5 | 1 | 32 | Inferior |

As shown in Table 2, for Examples 2-1 to 2-36 in which contents of Sb were from 3 wt % to 15 wt %, contents of Te were from 0.01 wt % to 1.5 wt %, and contents of Zn were 0.005 wt % to 1 wt %, crack-generation rates for all of the samples were below 25%, and thus, excellent results were obtained.

Furthermore, for Examples 2-2, 2-3, 2-6, 2-7, 2-14, 2-15, 2-18, 2-19, 2-26, 2-27, 2-30, and 2-31 in which contents of Sb were from 3 wt % to 15 wt %, contents of Te were from 0.05 wt % to 0.5 wt %, and contents of Zn were from 0.005 wt % to 0.1 wt %, crack-generation rates for all of the samples were below 10%, and thus, remarkably excellent results were obtained.

On the other hand, for Comparative Examples 2-1 and 2-2 in which contents of Zn were 0 wt %, the crack-generation rates were 34% and 31%, respectively. Thus, the samples were evaluated as inferior.

For Comparative Example 2-3 in which a content of Zn was 1.5 wt %, the crack-generation rate was 29%. Thus, the sample was evaluated as inferior.

For Comparative Example 2-4 in which a content of Zn was 0.001 wt %, the crack-generation rate was 25%. Thus, the sample was evaluated as inferior.

For Comparative Examples 2-5 to 2-12 in which contents of Sb were 2 wt % and 16 wt %, respectively, the crack-generation rates were 25% or higher. Thus, all of the samples were evaluated as inferior.

<Observations>

In cases of SnSb-type solders, SnSb compounds are formed, and such SnSb compounds are dispersed in the solders. Consequently, reliability of the solders is improved by enhancement of the dispersion.

As seen in Examples 2-1 to 2-36, when Sb, Te, and Zn are included besides Sn, the following effects were presumed. That is, SbSn compounds are finely dispersed. Furthermore, Te and Zn further form solid solution in Sn phases, and thus, dislocations are caused, thereby improving elongation properties at high temperature.

As seen from Comparative Examples 2-1 and 2-2, junction reliability is impaired in cases where no Zn is included but only Te is included, as compared with cases where Zn and Te are included.

It was deduced as follows. That is, dislocations were caused less frequently in such cases, compared with two elements having different ionic diameters are included, thus forming solid solutions in Sn phases. As a result, elongation properties at high temperature were not improved, and thus, this did not result in improvements on junction reliability.

As seen from Comparative Example 2-3, when the content of Zn was 1.5 wt %, the content of Zn is excessive, and thus, all of Zn could not form a solid solution in Sn phases. Consequently, Zn alloys were precipitated, and this did not lead to improvements on the junction reliability.

On the other hand, as seen from Comparative Example 2-4, in a case where the content of Zn was 0.001 wt %, the content of Zn is excessively small. Therefore, it was deduced that effects obtained by addition of Zn could not be obtained in this case.

As seen from Comparative Examples $_{2-5}$ to 2-8, in cases where contents of Sb were 2 wt %, evaluation results on heat cycles were inferior even if Te and Zn were included.

It was deduced that it amounts of SnSb compounds produced therein were smaller, and thus, dispersion-enhancing effects were lower.

As seen from Comparative Examples 2-9 to 2-12, in cases contents of Sb were 16 wt %, evaluation results on heat cycles were inferior even if Te and Zn were included.

It was deduced that, when amounts of Sb exceeded 15 wt %, ductibility of the solder alloys was deteriorated, thus impairing crack-resistant properties, while strength was improved due to precipitations of SnSb compounds.

Based on these results, it was revealed that the junction reliability is improved when the content of Sb is from 3 wt % to 15 wt %, the content of Te is from 0.01 wt % to 1.5 wt %, and the content of Zn is from 0.005 wt % to 1 wt %.

Furthermore, a crack-generation rate was below 10%, and remarkably excellent results were obtained, when the content of Sb is from 3 wt % to 15 wt %, the content of Te is from 0.05 wt % to 0.5 wt %, and the content of Zn is from 0.005 wt % to 0.1 wt %.

Examples 3 and 4

In Example 2, it was verified that improvements on elongation properties of the solder alloy at high temperature, which was confirmed in Example 1, could realize high junction reliability in an implementation structure that was close to conditions for actual power modules.

Furthermore, by varying amounts of Sb, Te, Co or Cr, which was an element added to alloys, ranges for elements that exhibit effects were confirmed.

In Example 3, Co was employed instead of Zn, which was employed in Example 2. In Example 4, Cr was employed instead of Zn. Except for these conditions, junction structures were prepared, and were subjected to the heat cycle test in the same conditions as Example 2.

Comparative Examples 3 and 4

In Comparative Example 3, Co was employed instead of Zn, which was employed in Comparative Example 2. In Comparative Example 4, Cr was employed instead of Zn. Except for these conditions, junction structures were prepared, and were subjected to the heat cycle test in the same conditions as Comparative Example 2.

Compositions for the solder alloys, crack-generation rates obtained through the heat-cycle test, and evaluation results are shown in Tables 3 and 4.

TABLE 3

| | Sn Content (wt %) | Sb Content (wt %) | Te Content (wt %) | Co Content (wt %) | Crack-generation rate (%) | Evaluation |
|---|---|---|---|---|---|---|
| Example 3-1 | Balance | 3 | 0.01 | 0.005 | 24 | Good |
| Example 3-2 | Balance | 3 | 0.05 | 0.005 | 8 | Excellent |
| Example 3-3 | Balance | 3 | 0.5 | 0.005 | 8 | Excellent |
| Example 3-4 | Balance | 3 | 1.5 | 0.005 | 22 | Good |
| Example 3-5 | Balance | 3 | 0.01 | 0.1 | 23 | Good |
| Example 3-6 | Balance | 3 | 0.05 | 0.1 | 8 | Excellent |
| Example 3-7 | Balance | 3 | 0.5 | 0.1 | 7 | Excellent |
| Example 3-8 | Balance | 3 | 1.5 | 0.1 | 22 | Good |
| Example 3-9 | Balance | 3 | 0.01 | 1 | 18 | Good |
| Example 3-10 | Balance | 3 | 0.1 | 1 | 21 | Good |
| Example 3-11 | Balance | 3 | 1 | 1 | 20 | Good |
| Example 3-12 | Balance | 3 | 1.5 | 1 | 23 | Good |
| Example 3-13 | Balance | 7 | 0.01 | 0.005 | 24 | Good |
| Example 3-14 | Balance | 7 | 0.05 | 0.005 | 8 | Excellent |
| Example 3-15 | Balance | 7 | 0.5 | 0.005 | 5 | Excellent |
| Example 3-16 | Balance | 7 | 1.5 | 0.005 | 20 | Good |
| Example 3-17 | Balance | 7 | 0.01 | 0.1 | 20 | Good |
| Example 3-18 | Balance | 7 | 0.05 | 0.1 | 7 | Excellent |
| Example 3-19 | Balance | 7 | 0.5 | 0.1 | 7 | Excellent |
| Example 3-20 | Balance | 7 | 1.5 | 0.1 | 20 | Good |
| Example 3-21 | Balance | 7 | 0.01 | 1 | 14 | Good |
| Example 3-22 | Balance | 7 | 0.1 | 1 | 22 | Good |
| Example 3-23 | Balance | 7 | 1 | 1 | 23 | Good |
| Example 3-24 | Balance | 7 | 1.5 | 1 | 24 | Good |
| Example 3-25 | Balance | 15 | 0.01 | 0.005 | 21 | Good |
| Example 3-26 | Balance | 15 | 0.05 | 0.005 | 5 | Excellent |
| Example 3-27 | Balance | 15 | 0.5 | 0.005 | 5 | Excellent |
| Example 3-28 | Balance | 15 | 1.5 | 0.005 | 20 | Good |
| Example 3-29 | Balance | 15 | 0.01 | 0.1 | 22 | Good |
| Example 3-30 | Balance | 15 | 0.05 | 0.1 | 8 | Excellent |
| Example 3-31 | Balance | 15 | 0.5 | 0.1 | 5 | Excellent |
| Example 3-32 | Balance | 15 | 1.5 | 0.1 | 16 | Good |
| Example 3-33 | Balance | 15 | 0.01 | 1 | 16 | Good |
| Example 3-34 | Balance | 15 | 0.1 | 1 | 23 | Good |
| Example 3-35 | Balance | 15 | 1 | 1 | 22 | Good |
| Example 3-36 | Balance | 15 | 1.5 | 1 | 23 | Good |
| Comparative Example 3-1 | Balance | 7 | 0.01 | 1.5 | 38 | Inferior |
| Comparative Example 3-2 | Balance | 7 | 1.5 | 0.001 | 33 | Inferior |
| Comparative Example 3-3 | Balance | 2 | 0.01 | 0.005 | 30 | Inferior |
| Comparative Example 3-4 | Balance | 2 | 0.01 | 1 | 25 | Inferior |
| Comparative Example 3-5 | Balance | 2 | 1.5 | 0.005 | 36 | Inferior |
| Comparative Example 3-6 | Balance | 2 | 1.5 | 1 | 35 | Inferior |

TABLE 3-continued

|  | Sn Content (wt %) | Sb Content (wt %) | Te Content (wt %) | Co Content (wt %) | Crack-generation rate (%) | Evaluation |
|---|---|---|---|---|---|---|
| Comparative Example 3-7 | Balance | 16 | 0.01 | 0.005 | 29 | Inferior |
| Comparative Example 3-8 | Balance | 16 | 0.01 | 1 | 27 | Inferior |
| Comparative Example 3-9 | Balance | 16 | 1.5 | 0.005 | 36 | Inferior |
| Comparative Example 3-10 | Balance | 16 | 1.5 | 1 | 34 | Inferior |

TABLE 4

|  | Sn Content (wt %) | Sb Content (wt %) | Te Content (wt %) | Cr Content (wt %) | Crack-generation rate (%) | Evaluation |
|---|---|---|---|---|---|---|
| Example 4-1 | Balance | 3 | 0.01 | 0.005 | 22 | Good |
| Example 4-2 | Balance | 3 | 0.05 | 0.005 | 9 | Excellent |
| Example 4-3 | Balance | 3 | 0.5 | 0.005 | 8 | Excellent |
| Example 4-4 | Balance | 3 | 1.5 | 0.005 | 23 | Good |
| Example 4-5 | Balance | 3 | 0.01 | 0.1 | 22 | Good |
| Example 4-6 | Balance | 3 | 0.05 | 0.1 | 9 | Excellent |
| Example 4-7 | Balance | 3 | 0.5 | 0.1 | 8 | Excellent |
| Example 4-8 | Balance | 3 | 1.5 | 0.1 | 23 | Good |
| Example 4-9 | Balance | 3 | 0.01 | 1 | 21 | Good |
| Example 4-10 | Balance | 3 | 0.1 | 1 | 20 | Good |
| Example 4-11 | Balance | 3 | 1 | 1 | 21 | Good |
| Example 4-12 | Balance | 3 | 1.5 | 1 | 24 | Good |
| Example 4-13 | Balance | 7 | 0.01 | 0.005 | 23 | Good |
| Example 4-14 | Balance | 7 | 0.05 | 0.005 | 9 | Excellent |
| Example 4-15 | Balance | 7 | 0.5 | 0.005 | 6 | Excellent |
| Example 4-16 | Balance | 7 | 1.5 | 0.005 | 19 | Good |
| Example 4-17 | Balance | 7 | 0.01 | 0.1 | 22 | Good |
| Example 4-18 | Balance | 7 | 0.05 | 0.1 | 8 | Excellent |
| Example 4-19 | Balance | 7 | 0.5 | 0.1 | 6 | Excellent |
| Example 4-20 | Balance | 7 | 1.5 | 0.1 | 21 | Good |
| Example 4-21 | Balance | 7 | 0.01 | 1 | 18 | Good |
| Example 4-22 | Balance | 7 | 0.1 | 1 | 23 | Good |
| Example 4-23 | Balance | 7 | 1 | 1 | 24 | Good |
| Example 4-24 | Balance | 7 | 1.5 | 1 | 24 | Good |
| Example 4-25 | Balance | 15 | 0.01 | 0.005 | 21 | Good |
| Example 4-26 | Balance | 15 | 0.05 | 0.005 | 6 | Excellent |
| Example 4-27 | Balance | 15 | 0.5 | 0.005 | 5 | Excellent |
| Example 4-28 | Balance | 15 | 1.5 | 0.005 | 19 | Good |
| Example 4-29 | Balance | 15 | 0.01 | 0.1 | 23 | Good |
| Example 4-30 | Balance | 15 | 0.05 | 0.1 | 9 | Excellent |
| Example 4-31 | Balance | 15 | 0.5 | 0.1 | 9 | Excellent |
| Example 4-32 | Balance | 15 | 1.5 | 0.1 | 16 | Good |
| Example 4-33 | Balance | 15 | 0.01 | 1 | 17 | Good |
| Example 4-34 | Balance | 15 | 0.1 | 1 | 22 | Good |
| Example 4-35 | Balance | 15 | 1 | 1 | 21 | Good |
| Example 4-36 | Balance | 15 | 1.5 | 1 | 24 | Good |
| Comparative Example 4-1 | Balance | 7 | 0.01 | 1.5 | 40 | Inferior |
| Comparative Example 4-2 | Balance | 7 | 1.5 | 0.001 | 39 | Inferior |
| Comparative Example 4-3 | Balance | 2 | 0.01 | 0.005 | 30 | Inferior |
| Comparative Example 4-4 | Balance | 2 | 0.01 | 1 | 32 | Inferior |
| Comparative Example 4-5 | Balance | 2 | 1.5 | 0.005 | 39 | Inferior |
| Comparative Example 4-6 | Balance | 2 | 1.5 | 1 | 33 | Inferior |
| Comparative Example 4-7 | Balance | 16 | 0.01 | 0.005 | 31 | Inferior |
| Comparative Example 4-8 | Balance | 16 | 0.01 | 1 | 30 | Inferior |
| Comparative Example 4-9 | Balance | 16 | 1.5 | 0.005 | 35 | Inferior |
| Comparative Example 4-10 | Balance | 16 | 1.5 | 1 | 38 | Inferior |

As a result, in the same manner as Example 2, it was revealed that, in Example 3, junction reliability was improved when the content of Sb was from 3 wt % to 15 wt %, a content of Te was from 0.01 wt % to 1.5 wt %, and a content of Co was from 0.005 wt % to 1 wt %.

Furthermore, crack-generation rates were below 100, and thus, remarkably excellent results were obtained, when the content of Sb was from 3 wt % to 15 wt %, the content of Te was from 0.05 wt % to 0.5 wt %, and the content of Co was from 0.005 wt % to 0.1 wt %.

It was revealed also in Example 4 that junction reliability was improved when the content of Sb was from 3 wt % to 15 wt %, a content of Te was from 0.01 wt % to 1.5 wt %, and a content of Cr was from 0.005 wt % to 1 wt %.

Furthermore, crack-generation rates were below 100, and thus, remarkably excellent results were obtained, when the content of Sb was from 3 wt % to 15 wt %, the content of Te was from 0.05 wt % to 0.5 wt %, and the content of Cr was from 0.005 wt % to 0.1 wt %.

Thus, it was confirmed that the junction reliability is improved by employing Zn, Co, and Cr as additive elements for solder alloys.

Example 5

In Example 5, it was verified that improvements on elongation properties of the solder alloy at high temperature, which was confirmed in Example 1, could realize high junction reliability in an implementation structure that was close to conditions for actual power modules.

Furthermore, all of Sb, Te, Zn, Co and Cr that serve as additive elements for solder alloys were included, and ranges for the elements that exhibited effects were confirmed by varying contents of these elements.

In view of the results obtained in Examples 2-4, while total amounts of Zn, Co and Cr were adjusted within a range from 0.005 wt % to 1 wt %, upper and lower limits of a composition of each of the elements were determined so as to cover compositional ranges employed in Example 1, to carry out the verification.

Comparative Example 5

In Comparative Example 5, solder alloys in which not only Zn but also Co or Cr were included in the same manner as Comparative Example 2 were employed. Junction structures were prepared, and the prepared junction structures were subjected to the heat-cycle test, under the same conditions as Comparative Example 2.

Compositions of the solder alloys, crack-generation rates obtained through the heat-cycle test, and evaluation results are shown in Table 5.

TABLE 5

|  | Sn Content (wt %) | Sb Content (wt %) | Te Content (wt %) | Zn Content (wt %) | Co Content (wt %) | Cr Content (wt %) | Zn + Co + Cr Total Content (%) | Crack-generation rate (%) | Evaluation |
|---|---|---|---|---|---|---|---|---|---|
| Example 5-1 | Balance | 3 | 0.01 | 0.002 | 0.002 | 0.001 | 0.005 | 17 | Good |
| Example 5-2 | Balance | 3 | 0.01 | 0.4 | 0.3 | 0.3 | 1 | 11 | Good |
| Example 5-3 | Balance | 3 | 1.5 | 0.002 | 0.001 | 0.002 | 0.005 | 22 | Good |
| Example 5-4 | Balance | 3 | 1.5 | 0.3 | 0.4 | 0.3 | 1 | 10 | Good |
| Example 5-5 | Balance | 15 | 0.01 | 0.005 | 0.005 | 0.005 | 0.015 | 19 | Good |
| Example 5-6 | Balance | 15 | 0.01 | 0.3 | 0.3 | 0.4 | 1 | 18 | Good |
| Example 5-7 | Balance | 15 | 1.5 | 0.001 | 0.002 | 0.002 | 0.005 | 21 | Good |
| Example 5-8 | Balance | 15 | 1.5 | 0.4 | 0.3 | 0.3 | 1 | 20 | Good |
| Comparative Example 5-1 | Balance | 2 | 0.01 | 0.005 | 0.005 | 0.005 | 0.015 | 33 | Inferior |
| Comparative Example 5-2 | Balance | 2 | 0.01 | 0.4 | 0.3 | 0.3 | 1 | 39 | Inferior |
| Comparative Example 5-3 | Balance | 2 | 1.5 | 0.005 | 0.005 | 0.005 | 0.015 | 35 | Inferior |
| Comparative Example 5-4 | Balance | 2 | 1.5 | 0.3 | 0.4 | 0.3 | 1 | 32 | Inferior |
| Comparative Example 5-5 | Balance | 16 | 0.01 | 0.005 | 0.005 | 0.005 | 0.015 | 29 | Inferior |
| Comparative Example 5-6 | Balance | 16 | 0.01 | 0.3 | 0.3 | 0.4 | 1 | 25 | Inferior |
| Comparative Example 5-7 | Balance | 16 | 1.5 | 0.005 | 0.005 | 0.005 | 0.15 | 28 | Inferior |
| Comparative Example 5-8 | Balance | 16 | 1.5 | 0.4 | 0.3 | 0.3 | 1 | 30 | Inferior |

As a result, as shown in Examples 5-1 to 5-8, crack-generation rates were 25-10%, and thus, evaluations resulted in good when the content of Sb was from 3 wt % to 15 wt %, the content of Te was from 0.01 wt % to 1.5 wt %, and the total content of Zn, Co and Cr was from 0.005 wt % to 1 wt %.

On the other hand, as shown in Comparative Examples 5-1 to 5-8, crack-generation rates were 25% or higher, and thus, evaluations resulted in inferior, even if the content of Te was from 0.01 wt % to 1.5 wt %, and Zn, Co and Cr were included, when the content of Sb was 2 wt % or 16 wt %.

For the case where the content of Sb was 2 wt %, it is deduced this is because there are few amounts of SnSb compounds, and thus, dispersion-enhancement effects are deteriorated.

For the case where the content of Sb was 16 wt %, it is deduced this is because ductibility of the solder alloys are impaired, thus deteriorating crack-resistant properties, although the strength is improved due to precipitation of SnSb compounds.

Based on results obtained in Examples 1-3, it was revealed that junction reliability is improved when the content of Sb is from about 3 wt % to about 15 wt %, the content of Te is from about 0.01 wt % to about 1.5 wt %, the content of at least one element selected from among Zn, Co and Cr is from about 0.005 wt % to 1 wt %, and the remainder is Sn.

In addition, the present disclosure includes combinations of any of the above-described various embodiments and/or examples. Consequently, each of advantages/technical effects brought about by each of the embodiments and/or examples would be realized according to such combinations.

Solder alloys and junction structures according to the disclosure makes it possible to improve elongation properties at high temperature, and crack-resistant properties in the junction structures. Therefore, the solder alloys and the junction structures can be employed for purposes of joining semiconductor elements such as power modules.

What is claimed is:

1. A solder alloy consisting of:
    3 wt % to 15 wt % of Sb;
    0.01 wt % to 1.5 wt % of Te;
    0.005 wt % to 1 wt % of at least one element selected from the group consisting of Zn, Co, and Cr; and
    a balance of Sn.

2. The solder alloy according to claim 1, wherein the total content of Zn, Co and Cr is from 0.005 wt % to 1 wt %.

3. The solder alloy according to claim 2, wherein the content of Zn is from 0.005 wt % to 1 wt %.

4. The solder alloy according to claim 2, wherein the content of Co is from 0.005 wt % to 1 wt %.

5. The solder alloy according to claim 2, wherein the content of Cr is from 0.005 wt % to 1 wt %.

6. The solder alloy according to claim 1, wherein the Sb content is 3 wt % or more and less than 5 wt %.

7. The solder alloy according to claim 1, wherein the content of Te is 0.01 wt % or more and less than 0.1 wt %.

8. The solder alloy according to claim 1, wherein the content of at least one element of the group consisting of Zn, Co, and Cr is more than 0.1 wt % and 1 wt % or less.

* * * * *